United States Patent [19]

Nienart

[11] 4,174,419

[45] Nov. 13, 1979

[54] STABILIZED MAGNETIC SHIELDS

[75] Inventor: Louis F. Nienart, Holland Township, Hunterdon County, N.J.

[73] Assignee: Allied Chemical Corporation, Morris Township, Morris County, N.J.

[21] Appl. No.: 959,026

[22] Filed: Nov. 8, 1978

[51] Int. Cl.$^2$ .................. B32B 15/00; B32B 5/18
[52] U.S. Cl. ..................... 428/313; 428/457; 428/900; 428/920; 156/60
[58] Field of Search ............... 428/313, 900, 920, 457; 156/60

[56] References Cited

U.S. PATENT DOCUMENTS

| | | | |
|---|---|---|---|
| 3,649,714 | 3/1972 | Wangsness | 260/887 |
| 3,772,129 | 11/1973 | Dover | 428/313 |
| 3,826,629 | 7/1974 | Pryor et al. | 428/313 |
| 3,845,805 | 11/1974 | Kavesh | 164/89 |
| 3,856,513 | 12/1974 | Chen et al. | 75/122 |
| 4,030,892 | 6/1977 | Mendelsohn et al. | 428/226 |

*Primary Examiner*—William J. Van Balen
*Attorney, Agent, or Firm*—Horst M. Kasper; Ernest A. Polin

[57] ABSTRACT

A composite mechanically stabilized, magnetic shield is provided which comprises a superposed layer adhesively bonded to a glassy metal alloy sheet (e.g. ribbon or fabric). Further, a procedure for providing mechanical stabilization for glassy metal alloy sheet is provided by bonding a superposed layer adhesively to the sheet. The construction results in a composite having a high degree of flexibility or rigidity. The adhesively bonded sheet prevents the glassy metal alloy ribbons or fabric from fraying when subjected to flexing and torsioning or handling. The stabilized magnetic shields are useful as electromagnetic shields in electronics and communications.

16 Claims, No Drawings

STABILIZED MAGNETIC SHIELDS

FIELD OF THE INVENTION

This invention relates to a process for adhesively bonding magnetic glassy metal alloy sheet to superposed layers for obtaining mechanically stable, rigid or flexible composite structures and stabilized magnetic shields and to the magnetic composite structure obtained thereby.

BACKGROUND OF THE INVENTION

Electromagnetic shields are used for minimizing or reducing to substantially zero electromagnetic fields which may interfere with the operation of electrical and magnetic devices. For example, in color television receivers, the electron beam of the picture tube generally requires shielding from interference by D.C. magnetic fields created by the earth and by 60 Hz fields which are produced within the receiver by transformers and other electrical components. Similarly, the magnetic recording tape used in magnetic recording devices must also be shielded from stray fields.

Such shields usually consist of punched and drawn stampings made of crystalline alloys, usually highly magnetically permeable alloys, for example, such as the 80/20 nickel-iron series (sold under the trademarks Mumetal, Hymu 80, Moly Permalloy), or the 50/50 nickel-iron series (sold under the trademarks 4750 Alloy, Hipernik). Where high saturation induction at moderate permeability is required, ingot iron or 3 percent silicon-iron is often employed.

Mendelsohn in U.S. Pat. No. 4,030,892 issued June 21, 1977 discloses a flexible electromagnetic shield, which comprises fabrics of glassy metal alloys. The flexible electromagnetic shields as disclosed by Mendelsohn retain their outstanding magnetic characteristics even after being strained. However, such fabrics may unravel and fray when subjected to flexing and tortioning. Accordingly, there is a need for providing mechanical stability to glassy metal alloy electromagnetic shields, as well as other products made from the glassy metal alloys.

SUMMARY OF THE INVENTION

In accordance with the present invention, mechanically stabilized magnetic composite structures comprise a superposed layer adhesively bonded to a magnetic glassy metal sheet.

The preferred glassy metal alloy consists essentially of about 70 to 90 atom percent of at least one metal selected from the group consisting of iron and cobalt, up to about three-fourths of which may be replaced by nickel, and the balance at least one metalloid selected from the group consisting of boron, carbon and phosphorus, up to about three-fifths of which may be replaced by silicon and up to about one-third of which may be replaced by aluminum, plus incidental impurities. The glassy metal alloy is obtained by rapidly quenching the glass-forming metal alloy at quench rates in excess of about $10^4$° to $10^6$° C. per second by depositing the molten metal onto the surface of a rapidly moving chill body, as for example described by Chen et al. in U.S. Pat. No. 3,856,513. A method is provided for adhesively bonding a superposed layer to a magnetic glassy metal alloy sheet. Adhesive is applied to the superposed layer or the glassy metal alloy sheet and the superposed layer or the glassy metal alloy sheet are joined to the adhesive side of the glassy metal alloy sheet or superposed layer, respectively.

The stabilized magnetic shields of the present invention are useful as protection means against static magnetic fields and electromagnetic radiation fields in electronics, communications and instrumentation.

DETAILED DESCRIPTION OF THE INVENTION

The laminating system of the invention provides mechanical stabilization for magnetic glassy alloy metal sheets. Glassy metal alloy sheets include glassy metal alloy material in various forms such as fabric, ribbon, flake, foil, tape and the like which are suitable for supporting and forming two dimensional structures. Ribbons can have various widths.

The laminating system of the present invention is applicable to glassy metal alloys in the various forms which can be produced. Preferred forms of metallic glass include filament, ribbon and sheet. Preferably, wide ribbon is employed in the invention.

Metallic glassy alloy fabrics include any glassy metal alloy cloth, webs, fabrics, textiles, woven materials or lace.

The term "glassy", as used herein, means a state of matter in which the component atoms are arranged in a disorderly array; that is, there is no long range order. Such a glassy material gives rise to broad, diffuse diffraction peaks when subjected to electromagnetic radiation having wavelengths in the X-ray region (about 0.01 to 50 Angstrom wavelength). This is in contrast to crystalline material, in which the component atoms are arranged in an orderly array, giving rise to sharp diffraction peaks. Primarily glassy material may include a minor amount of crystalline material. While the alloy is primarily glassy, it is preferred that it be substantially glassy in order to take advantage of the increasing ductility of the filaments with increasing degree of glassiness.

Unique properties of the laminates include high quality appearance and texture of the surface, the flexibility of the superposed layer adhesively bonded to the glassy metal alloy sheet, the ability of the superposed layer to prevent a fabric form from fraying when subjected to flexing and tortioning and improved electromagnetic shielding properties. The improvement in electromagnetic shielding depends on the properties of the superposed layer. If the superposed layer is a good conductor the shielding of the laminate can cover a wide range of frequencies in the electromagnetic spectrum. Other desirable features of the laminating system include the optional use of wide, oriented glassy metal alloy ribbons instead of fabric and a simple adhesive bonding system to facilitate handling. The capability of such an adhesive bonding system to be used at room temperature is characterized by a convenient time interval for adhesive bonding.

More preferred are fabrics woven from metallic glass ribbons or wires such as disclosed by Mendelsohn et al. in U.S. Pat. No. 4,030,892. The glassy alloy consists of about 75 to 87 atom percent of at least one metal consisting of iron and cobalt, up to about three fourths of which may be replaced by nickel and the balance at least one metalloid selected from the group consisting of boron, carbon and phosphorus, up to about one third of which may be replaced by an element selected from the group consisting of silicon and aluminum, plus incidental impurities. Such materials can have permeabilities of at least 25,000 and a coercivity of less than about 0.08 oersted.

The preferred glassy metal alloys employed in the invention consist essentially of about 70 to 90 atom percent of at least one metal selected from the group consisting of iron and cobalt, up to about three-fourths of which may be replaced by nickel, and the balance at least one metalloid selected from the group consisting of boron, carbon and phosphorus, up to about three-fifths of which may be replaced by silicon, and up to about one-third of which may be replaced by aluminum, plus incidental impurities. The partial replacement of iron and/or cobalt by nickel may result in higher permeability values. The partial replacement of the metalloid elements may be made in order to aid formation of the glassy filament during casting from the molten state and/or to improve its properties, including its magnetic properties.

The replacement by nickel of more than about three-fourths of the total amount of iron and/or cobalt tends to reduce the residual induction and hence the flux carrying capacity to unacceptably low levels. A preferred maximum replacement by nickel is about three-fifths of the total amount of iron and/or cobalt to maintain a reasonably high flux carrying capacity.

The glassy metal alloys employed in the invention include, without the partial replacement of metals and metalloids, compositions consisting essentially of about 70 to 90 atom percent of at least one of iron and cobalt and the balance at least one of boron, carbon and phosphorus. Examples include the following nominal compositions: $Fe_{80}B_{20}$, $Fe_{86}B_{14}$, $Co_{74}Fe_6B_{20}$, $Fe_{64}Co_{16}B_{20}$ and $Fe_{69}Co_{18}B_{13}$ (the subscripts are in atom percent). The glassy metal alloys employed in the invention also include, with maximum partial replacement of both metal and metalloid elements, compositions consisting essentially of about 19 to 22 atom percent of at least one of iron and cobalt, about 56 to 65 atom percent of nickel, about 9 to 17 atom percent of at least one of boron, carbon and phosphorus and about 4 to 8 atom percent of at least one of silicon and aluminum. Compositions intermediate the minimum and maximum replacement ranges, such as $Fe_{40}Ni_{40}P_{14}B_6$, $Ni_{50}Fe_{30}B_{20}$ and $Ni_{49}Fe_{29}P_{14}B_6Si_2$, are also included.

Up to about 10 atom percent of iron and/or cobalt may also be replaced by other transition metal elements which are commonly alloyed with iron and cobalt, without deleteriously affecting the desirable magnetic and mechanical properties of the glassy metal alloys employed in the invention. Such replacement may be made in order to obtain enhancement of specific properties, such as hardness, corrosion resistance and the like. Examples of such transition metal elements include chromium, molybdenum, copper, manganese, vanadium, niobium, tantalum and tungsten. Examples of glassy alloys suitably employed in the invention include the following nominal compositions: $Fe_{63}Co_{15}Mo_2B_{20}$, $Fe_{40}Ni_{38}Mo_4B_{18}$, $Fe_{71}Mo_9C_{18}B_2$, $Fe_{37}Ni_{37}Cr_4B_{22}$, $Fe_{67}Ni_{10}Cr_3B_{20}$, $Fe_{78}Mo_2B_{20}$, and $Fe_{40}Ni_{38}Mo_4B_{18}$. Cobalt-containing compositions of glassy alloys suitable for use in the shielding envelopes of the present invention include those having the formula

wherein u is from about 40 to 80, v is from about 5 to 10, w is from about 10 to 30, and z is from about 15 to 20, all in atomic percent with the proviso that the sum of u+v+w+z equals 100.

It will be appreciated that the constituent elements of nominal compositions may be varied a few atom percent without substantial change in properties. The purity of all compositions is that found in normal commercial practice.

At a given field strength, the higher the permeability of the glassy metal alloy, the greater the effectiveness of a magnetic shield. A maximum permeability of at least about 25,000 is considered necessary to develop practically useful shielding. Preferably, the maximum permeability is at least about 100,000. Such values, which may be achieved by proper selection of alloy composition and/or by suitable processing of the electromagnetic shields desirably increase the shielding ratio.

Glassy alloys such as $Fe_{40}Ni_{40}P_{14}B_6$ and $Fe_{80}B_{20}$ have the advantage that they develop their exceptionally high permeability as quenched during their processing. Details of the processing conditions and procedures to form glassy metal alloys are readily available; see, e.g. U.S. Pat. Nos. 3,856,513 and 3,845,805, issued Dec. 24, 1974 and issued Nov. 5, 1974, respectively.

Table I shows the remarkable shielding ratio performance of exemplary glassy alloys suitable for shielding purposes. Also shown in Table I are the improved properties of these glassy alloys resulting from field annealing. In Table I, $B_s(80)$ is the saturation induction at a field of 80 Oe, $u_{max}$ is the maximum permeability, and $H_c$ is the coercive force. These glassy alloys, which are conveniently processed according to the teachings of U.S. Pat. No. 3,856,513, in their as-quenched condition can be strained to appreciable stresses, such as to about 10,000 to 15,000 psi, without substantial loss in magnetic properties after the strain is removed. The iron-nickel alloy in Table I is particularly useful for low field applications (less than 2.5 oersteds) where high permeability is desired. The iron alloy in Table I is most suited where high saturation together with high permeability is desired. While Table I gives two examples of alloys suitable in the practice of the invention, it will be appreciated that the other glassy alloys possessing at least the minimum magnetic properties described above are also suitable.

TABLE I

| Alloy Atom percent | $B_s(80)$, Gauss | max. | $H_c$, Oersteds |
|---|---|---|---|
| $Fe_{40}Ni_{40}P_{14}B_6$ As-Quenched | 6,000 to 8,000 | 65,000 | 0.05 |
| $Fe_{40}Ni_{40}P_{14}B_6$ Field Annealed* | 7,700 | 800,000 | 0.007 |
| $Fe_{80}B_{20}$ As-Quenched | about 16,000 | up to about 102,000 | 0.08 |
| $Fe_{80}B_{20}$ Field Annealed** | about 16,800 | 300,000 | 0.04 |

*Annealed at 325° C. for 2 hr at 10 Oe in partial vacuum (1000 m)
**Annealed at 325° C. for 3 hr at 10 Oe in partial vacuum (1000 m)

Superposed layers include stable and essentially two-dimensional configurations. Such layers may be prepared from natural or synthetic materials.

Suitable inorganic materials for superposed layers include glass fiber fabrics, sheet glass, mica plates, asbestos fabrics, asbestos composites, sheetrock, metal in plate and foil forms such as aluminum foil, steel plate, copper foil, silver foil, tin foil, crystals such as silicon, and the like.

Organic materials for superposed layers include graphite fabric, laminated wood, formica, roofing felt, pressed wood laminates, pressboard, paper, pergament, leather, artificial leather, cardboard, woven cotton, wool, silk, polymers and copolmers such as nylon, polyester, polyurethane, films of polystyrene, thermoplastics, polyethylene, polypropylene, polyvinyl chloride.

Structural superposed layers for supporting the structures include sheetrock, paneling, composition board, wall tiles, steel plates, foam boards, and plastic sheet.

Material suitable as adhesive for bonding the superposed layer to glassy metal alloy sheet include various resins and polymers. Preferred adhesives include silicone resins, epoxidized and epoxy resins, polyvinyl chloride, phenolic resins, polyamides, polyethers, polysulfones and polyesters. Also included are phenol-formaldehyde epoxy resins, and resin blends such as phenolic/vinyl blends, phenolic/polyvinyl butyral, phenolic/polyvinyl formal, phenolic-butadiene-acrylonitrile rubber, polyvinyl acetate-phenolic resin, neoprene rubber/phenolic resin, nitrile rubber/phenolic resin, neoprene rubber/phenolic resin, nitrile rubber/phenolic resin, and the like. These resins may be applied from their solutions in suitable organic solvents such as acetone, methylethylketone, tetrachloroethylene, acetylacetonate, ether, dioxane, glyme, decahydronaphthalene, or from their dispersion in aqueous media or organic swelling agents, as is well known to those skilled in the art. The resins may be further modified by inclusion of fillers, modifiers, accelerators, curing agents, wetting agents, blocking agents, diluents, antioxidants, and the like. Even more preferred adhesives are flame resistant polymers, adhesives such as silicone resins, latex, natural and synthetic rubbers.

Formulations useful as bonding adhesives are known. For example, D. A. Wangness et al. in U.S. Pat. No. 3,649,714 disclose a mixture of a dicyanate and a compatible uncured elastomer such as acrylonitrile-butadiene copolymer for a nonvolatile, film forming, heat curable adhesive. Plastisol composition can also be employed comprising 100% solids dispersion in plasticizer blends.

Methods for bonding the superposed layer to the glassy metal alloy sheet include dipping the alloy sheet or the superposed layer into a solution of the adhesive, applying the adhesive solution to the sheet or layer with a brush, spraying adhesive solution to either sheet or layer or coating or painting or brushing solution of the adhesive to sheet or layer. The adhesive can also be applied by impregnation or wet coating.

The adhesive can be applied by various types of coating machines, e.g. a levelon coater with or without reverse smoothing roll, a knife-over-roll coater, a sequential knife coater, a floating knife coater, a blanket knife coater, an inverted knife coater, a drum cast coater, a metal belt precast coater, a fusion-extrusion coater. The amount of adhesive applied can be controlled with a coating knife.

For obtaining patterns an engraved roll coating unit can be employed. The lamination can be wet lamination or dry lamination, i.e. a thermoplastic type.

Also multiple ply drum lamination with adhesives can be performed. Thermoplastic foam lamination can employ either a dry or wet process. An additional step of embossing and printing can be advantageously combined.

It is also possible to hold together the structure by application of "sticky" adhesive tape, which may be distributed over a covering of metallic glass sheets.

After application of the adhesive to the glassy metal alloy sheet or to the superposed layer a curing process is preferably employed. Cure can be effected by processes such as drying, polymerization, plasticizer absorption, solidification from a hot melt, or evaporation of dispersant. The type of cure is not critical—provided the curing conditions are compatible with the metallic glass, i.e., they would not adversely affect its desirable properties in a material way—and a combination of curing methods can be employed depending on the type of resin formulation. Generally, overnight curing is preferred which may take place at elevated temperatures for certain times depending on the material used for bonding to the metallic glass. The curing process can be speeded by addition of catalysts to the adhesive or by treating the composite. Glassy metal alloy fabrics laminated to sheet show increased stability.

While a glassy metal alloy fabric can be frayed and exhibits limited impact strength and while the superimposed layer by itself may possess a higher tensile strength, the laminated glassy metal alloy fabric has no tendency to fray, has good impact strength and good tensile strength. Magnetic shielding properties of a regular weave are made more permanent by the laminating process by preventing shifting of the ribbons making up the composite. The laminated fabric exhibits in addition vibrational damping when compared to pure glassy metal alloy fabric. Laminated glassy metal alloy fabrics can be impermeable to gases and liquids and can inhibit air convection. Laminating of a glassy metal alloy fabric leads to stabilization without crimping and cold working. The lamination can be applied to a deformed glassy metal alloy and serves to stabilize such form. A laminated glassy metal alloy fabric also can exhibit lower heat transfer than pure glassy metal alloy fabric.

As stated above, the electromagnetic shields of the present invention retain their outstanding magnetic characteristics even after being strained within the limits of the bonding strength.

Lamination of the glassy metal alloy fabric results in diminished galvanic coupling of the composite with other metals.

When the laminating sheet is an electrically conducting metal such as copper, silver, aluminum and the like, then the electromagnetic shielding properties are effective over a broad frequency range, even above 1 MHz.

When the laminating sheet is a plastic as a film or foam sheet then the glassy metal fabric laminate is useful as being simultaneously magnetically shielding and electrically insulating.

The lamination of the metallic glass fabric in addition can impart a favorable appearance regarding color, gloss and feeling of the laminate.

The laminated magnetic shields of the present invention have a multiplicity of uses. They are suitable for all uses to which the flexible electromagnetic shields by Mendelsohn et al. are applicable. In addition the magnetic shields of the present invention can be applied to structural forms without flexibility. For example, the shields of the present invention are suitable for shielding rooms against intensive electromagnetic radiation, for electromagnetically shielded inflated temporary buildings, for improving static dissipation and for microwave antennas and the like.

EXAMPLE 1

A polyvinyl chloride film of a thickness of about 18 microns was applied to one side of a glassy metal alloy fabric. A laminate was made as follows: The film was painted with a water base latex adhesive (Polystix #3731, Adhesive Products Corp.) with a brush and allowed to dry for 20 minutes.

The glassy metal alloy fabric was then applied to the surface for obtaining an instant bond. The film was found to be strippable from the glassy metal alloy.

EXAMPLE 2

Aluminum foil was laid on a flat smooth surface and one side covered with a water based latex adhesive (Polystix #3731). The metallic glass shield was laid on the foil and then a rubber roll was run over the foil surface to make it conform to the shape of the woven glassy metal alloy fabric. The procedure was repeated for the other side to give two thicknesses of aluminum foil.

After the aluminum foil was adhesively bonded to the fabric, its surface was coated with the same adhesive and the adhesive surface covered with release paper. The shield was then attached to another surface by the user by simply stripping off the release paper.

EXAMPLE 3

Aluminum foil was laid on a flat smooth surface and one side was covered with a water base latex elastomeric adhesive solution such as Polystix #3731, Gripstix #1556, or M3258 (acrylic latex) pressure sensitive adhesives. A glassy metal alloy fabric was laid on the foil and pressed flat. Another layer of the adhesive was applied to the exposed glassy metal alloy surface and covered with metallic glass fabric or ribbon with a specific orientation. This procedure was repeated until a sufficient thickness of metallic glass was reached. A cover sheet was adhesively bonded such as any metallic foil or non-metallic film.

EXAMPLE 4

Alternate layers of glassy metal alloy fabric and aluminum foil were adhesively bonded to form a composite. The adhesive layer consisted of a polymeric foam based on polyurethane and coated on both sides with a pressure sensitive adhesive. This type of construction produced complex shapes that were structurally self-supporting.

EXAMPLE 5

Low carbon steel sheet (#10 gage thick) Al was laid flat and one side covered with an adhesive to bond rigid polymeric foam. Adhesive coated glassy metal alloy fabric was bonded to the rigid foam. Additional layers of magnetic shielding were added to the composite in accordance with Example 4. This construction was useful for partitions, curtain wall panels and the like.

I claim:
1. A magnetic composite structure comprising a superposed layer adhesively bonded to a glassy metal alloy sheet.
2. The composite structure as set forth in claim 1 wherein the superposed layer comprises a layer of rigid foam.
3. The composite structure as set forth in claim 1 wherein the superposed layer is a polymer foam.
4. The composite structure as set forth in claim 2 further comprising a second layer of rigid foam adhesively bonded to the glassy metal alloy sheet and a structural board adhesively bonded to the second layer of rigid foam.
5. The composite structure as set forth in claim 1 wherein the superposed layer is a metal foil.
6. The composite structure as set forth in claim 5 wherein the superposed layer is an aluminum foil.
7. The composite structure as set forth in claim 1 wherein the glassy metal alloy is in ribbon form.
8. The composite structure as set forth in claim 1 wherein the glassy metal alloy is in fabric form.
9. The composite structure as set forth in claim 1 wherein the superposed layer is a polymeric film.
10. The composite structure as set forth in claim 9 wherein the polymeric film is bonded to the glassy metal alloy sheet with a pressure sensitive binder.
11. The composite structure as set forth in claim 9 wherein the polymeric film is a polyvinyl chloride film.
12. The composite structure as set forth in claim 9 wherein the polymeric film is a nylon film.
13. The composite structure as set forth in claim 1 wherein the adhesive and superposed layer are fire resistant.
14. The composite structure as set forth in claim 1 wherein the glassy metal alloy sheet has a maximum permeability of at least about 25,000.
15. The structure as set forth in claim 1 wherein the glassy metal alloy sheet consists essentially of about 70 to 90 atom percent of at least one metal selected from the group consisting of iron and cobalt, up to about ¾ of which may be replaced by nickel, and the balance at least one metalloid selected from the group consisting of boron, carbon and phosphorus, up to about 3/5 of which may be replaced by aluminum, plus incidental impurities.
16. A method for adhesively bonding a superposed layer to a magnetic glassy metal alloy sheet comprising:
   (a) applying an adhesive to the superposed layer or the alloy sheet; and
   (b) joining the superposed layer or glassy metal alloy sheets to the adhesive side of the glassy metal alloy sheet or superposed layer, respectively.

* * * * *